June 6, 1967 D. K. THOVSON 3,324,310

TRANSISTOR TUNNEL DIODE HIGH SPEED RING COUNTER

Filed May 27, 1964

INVENTOR
D. K. THOVSON
BY Ray M. Porter Jr.
ATTORNEY

United States Patent Office 3,324,310
Patented June 6, 1967

3,324,310

TRANSISTOR TUNNEL DIODE HIGH SPEED RING COUNTER

Dennis K. Thovson, Murray Hill, N.J., assignor to Bell Telephone Laboratories, Incorporated, New York, N.Y., a corporation of New York Filed May 27, 1964, Ser. No. 370,536
3 Claims. (Cl. 307—88.5)

This invention relates to digital circuits and more particularly to multistage sequential switching or shifting circuits employing a transistor and a negative resistance diode as a bistable stage.

Sequential switching circuits are useful in digital systems as signal timing sources to sequentially control the operation of system components. As the speed and complexity of such systems have increased, a concomitant need has arisen for shifting circuits that are reliably fast and yet simple.

A major limitation upon the speed capabilities of shifting circuits has been the relatively slow switching times of the available bistable switching stages. To meet this problem, a switching transistor in combination with a negative resistance element such as a tunnel diode has been used in shifting circuits as a basic switching element. However, a problem often encountered in shifting circuits such as shift registers or ring counters using this basic bistable flip-flop switch has been to provide a simply constructed circuit arrangement without sacrificing the available switching speeds and without being constrained to use input pulses of different polarity and/or phase in order to shift information along the stages.

Accordingly, it is an object of this invention to provide an improved sequential switching circuit.

Another object of this invention is to provide a high speed shifting circuit of simple design which is responsive to unipolar input shift pulses.

These and other objects of the present invention are realized in a specific illustrative shifting circuit embodiment that includes a plurality of stages each of which comprises a first switching transistor and a negative resistance diode, the combination of which is biased to have two stable states and to provide a fast switching element. Successive switching elements are coupled by a second transistor which acts as a gating and steering element. The composite array of cascaded stages including the interstage coupling is arranged so that digital information is either read out in parallel or is advanced serially to the end of the chain in response to unipolar input pulses applied simultaneously to each of the coupling transistors. The digital information as represented by the state of a stage is advanced along the chain of cascaded stages in response to an input pulse which, together with the conducting state of the particular switch which is ON, causes the coupling transistor to operate and turn ON a succeeding switching stage in the chain. The provision of a biasing arrangement for the cascaded array of stages which constrains the source current so that only one switching element can stably remain in the ON or conducting state with all others in the OFF or nonconducting state insures that the previously conducting stage becomes nonconducting and the succeeding switching stage remains in the conducting state.

It is a feature of this invention that each switching stage comprises a switching transistor and a negative resistance diode biased for bistable operation.

It is another feature of this invention that a gating transistor is provided for interstage coupling to perform a pulse steering function.

It is still another feature of this invention that a biasing arrangement provided for the cascaded array of stages to insure that only one stage can remain conducting and all others must be nonconducting when steady state is reached.

A complete understanding of the present invention and of the above and other features and advantages thereof may be gained from a consideration of the following detailed description of an illustrative embodiment thereof presented hereinbelow in connection with the accompanying drawing in which.

Figure 1:
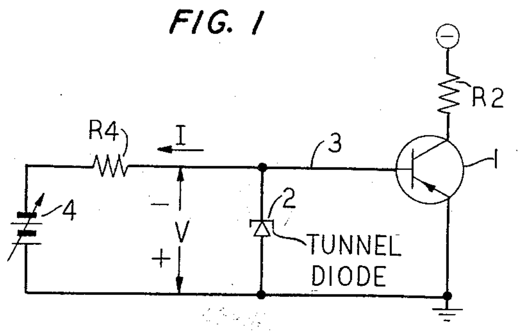
FIG. 1 depicts the basic switching stage.

The basic switching stage as shown in FIG. 1 comprises a high speed switching transistor 1 in a common emitter configuration with a negative resistance device such as a tunnel diode 2 connected between base and emitter electrodes. Tunnel diodes and their operative characteristics are described in the literature: see for example H. S. Sommers, Jr. in the Proceedings of the I.R.E. July 1959 at page 1201. The diode 2 is connected to the transistor electrodes and biased so that either a fixed low voltage or a fixed higher voltage appearing across the diode is applied to the base-emitter junction of transistor 1 to bias the transistor switch in its cutoff or its saturated state respectively as will be explained hereinafter in connection with FIG. 2.

Figure 2:
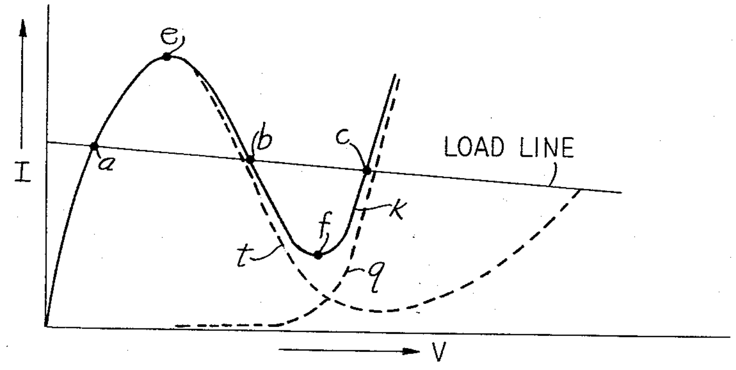
FIG. 2 is a volt ampere characteristic useful in explaining the operation of the basic bistable switching stage.

The composite switch current $i$ as a function of the switch voltage $v$, which quantities are defined by reference to FIG. 1, is graphically shown in FIG. 2 along with the separate $v$–$i$ characteristics of the transistor and the tunnel diode. If the base lead 3 of FIG. 1 is opened up and a plot of the characteristics of the tunnel diode is made with the aid of variable source 4, the dotted curve labeled $t$ in FIG. 2 is obtained. Similarly, if tunnel diode 2 is removed from the circuit of FIG. 1 and a plot is made of the volt ampere characteristics of the emitter-base junction of the transistor, the dotted curve $q$ is obtained. Therefore, when the two semiconductor devices are connected as shown in FIG. 1 the resultant composite characteristic is obtained by the superposition of curves $t$ and $q$ as depicted by the solid curve $k$ of FIG. 2. In the low voltage region, curve $k$ approximates curve $t$ since the transistor base current in this region is very much smaller than the tunnel diode current, while in the higher voltage region where transistor base current dominates, the tunnel diode current curve $k$ approximates curve $q$.

A load line whose slope corresponds to the negative slope of resistance R4 (shown in FIG. 1) can be plotted on the coordinate of FIG. 2. When the value of this resistor is judiciously chosen, the load line intersects the composite curve $k$ at three points $a$, $b$, and $c$. Point $b$ is in a region of negative resistance and therefore represents an unstable condition of the switch. Points $a$ and $c$, however, exist on portions of the composite characteristic having positive slope and, therefore, correspond to the portions of the curve representing positive values of resistance and thereby represent stable conditions. It is to be noted that point $a$ is a low voltage stable point of operation while point $c$ is a relatively high voltage stable point of operation.

Thus, it is evident that by employing the extremely fast switching and bistably biased tunnel diode in combination with a switching transistor, a fast switch that provides two stable output voltages at the collector of the transistor is obtained. The two stable output voltages can be made to differ sufficiently in magnitude from each other so that a practical and useful bistable flip-flop device is obtained.

Figure 3:
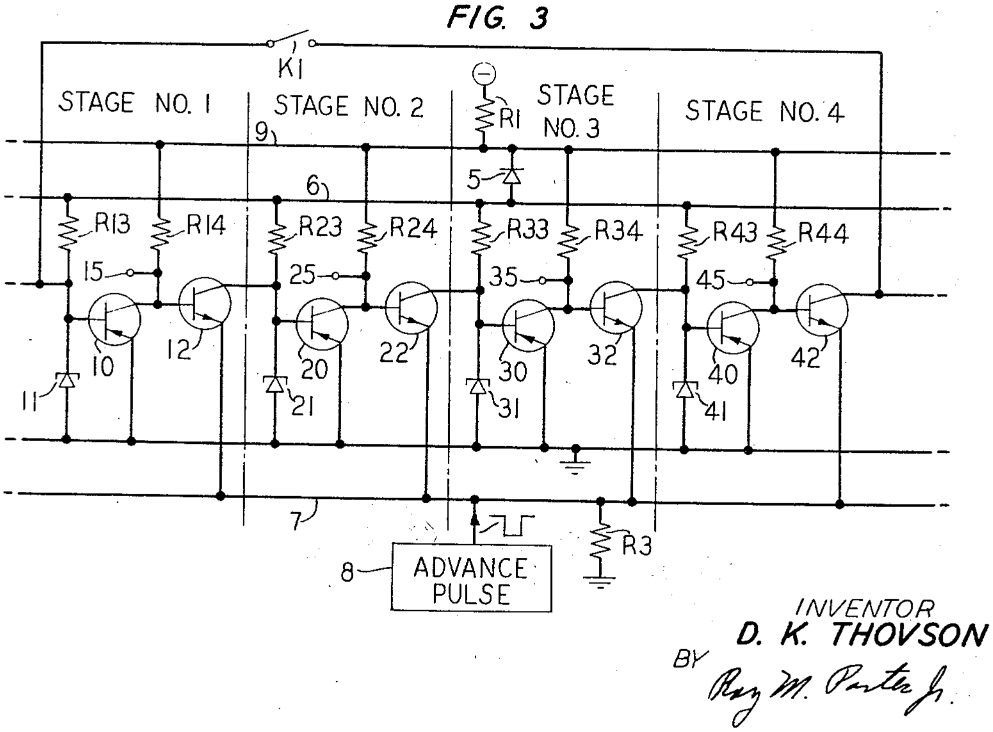
FIG. 3 is a schematic diagram of one form of improved shifting circuit which illustratively embodies the principles of the present invention.

The circuit shown in FIG. 3 is a shifting circuit employing four such transistor tunnel diode switches in cascade with a steering transistor providing the interstage coupling. Each transistor tunnel diode combination is biased to provide the bistable operation described in connection with FIG. 2. It is to be understood that the four stages shown are by way of illustration only since the number of stages can be varied as desired. Typical of each stage is stage 1 comprising switching transistor 10, tunnel diode 11, and steering transistor 12. The switching transistor 10 is connected in a common emitter configuration and the tunnel diode 11 is biased by means of resistor R13 so that the composite switch is arranged for bistable operation as depicted in FIG. 2. Power is supplied from a negative battery to the cascaded chain of bistable switches by means of resistor R1 and zener diode 5. Conductor 9, which is at the cathode potential of zener diode 5, supplies the biasing potential for each of the switching transistors 10, 20, 30, and 40 through their respective collector resistors, and conductor 6 which is at the anode potential of diode 5 supplies the biasing potential for the tunnel diodes 11, 21, 31 and 41. The emitters of each of the switching transistors are connected in common to ground. The emitters of each of the stage coupling transistors 12, 22, 32, and 42 are connected in common to the advance pulse input source 8 by means of conductor 7, and the other two electrodes of the coupling transistors couple the output of a previous flip-flop to the input of the next adjacent flip-flop.

The chain of cascaded stages shown may be connected to form either a shift register or a ring counter. When switch K1 is open as shown, the shifting circuit is connected as a shift register, but when the switch is closed, a ring counter is formed. Accordingly, information can be extracted in parallel from the shifting circuit at the outputs or collectors of each of the switching transistor stages designated by terminals 15, 25, 35, and 45, or the information can be advanced serially along the chain to be read out at the last stage.

Source current for biasing each of the transistor tunnel diode stages is constrained by resistance R1 to that value which is sufficient to turn only one of the stages fully ON. The fully ON condition which is representative of the switching transistor in a saturated condition and the tunnel diode in its high voltage state is shown in FIG. 2 as point *c*. As a result of this biasing scheme the cascaded chain of stages can be arranged so that when the power is applied either a single selected stage is turned ON or a single stage operates at random.

A single stage can be made to operate or be turned ON at random because each of the semiconductive devices in the chain has parameters (such as amplification factors) which differ slightly from the values of every other similar device. At the moment power is applied, one particular transistor tunnel diode switch will begin to move towards its operated or ON condition faster than the rest. As the transistor in that particular flip-flop switch approaches its saturation region a greater percentage of the source current flowing through resistor R1 finds a path through that stage at the expense of the remaining stages. Once steady state is reached, practically all of the current from the source flowing through resistor R1 flows through the single stage which has been turned ON.

If it is desired to insure that a particular single flip-flop switch, for example, the switch in stage 1, operates when the power is applied, either tunnel diode 11 can be selected to have a lower peak value of current (as represented by point *e* on the curve of FIG. 2) than the other flip-flop tunnel diodes, or resistor R13 can be selected to be appropriately lower in value than the corresponding resistors R23, R33, and R43. Either or both of these techniques can be used, therefore, to insure that a particular selected flip-flop is the one that is initially operated when power is applied.

Assuming now that the power has been applied and the flip-flop of stage 1 is in the operated condition, the collector voltage of transistor 10 is, therefore, approximately at ground potential since the collector-to-emitter junction potential drop is very small when the transistor is in a saturated state. The collectors of each of the other transistors 20, 30, and 40 are approximately at the potential of conductor 9 and, therefore, considerably more negative than ground. If now a negative advance pulse from source 8 is simultaneously applied to the emitters of each of the coupling transistors (12, 22, 32, and 42) via conductor 7 and the magnitude of the pulse is less than the magnitude of the negative potential at the collectors of the cut-off switching transistors (20, 30, and 40) but more than zero (the approximate potential at the collector of transistor 10 and consequently the potential of the base of transisor 12) only the base-emitter junction of transistor 12 becomes forward biased. Thus, it is evident that the coupling transistors function as logic gating elements since they produce a pulse output only in response to the application of an advance pulse to the emitter of a coupling transistor whose base electrode is connected to a flip-flop transistor whose collector is at ground potential.

The pulse appearing at the emitter of transistor 12, the only gate which has been opened, is transmitted without inversion to the collector of transistor 12 and appears at the input of the second stage in sufficient magnitude to cause the switch to change from its unoperated to its operated state. This occurs because the current through the composite arrangement of the transistor tunnel diode flip-flop of stage No. 2 is momentarily increased from point *a* of FIG. 2 to a value above point *e*. Once this occurs the switch passes very rapidly through its unstable region (as depicted by the portion of curve *k* between the points *e* and *f*) to the stable point *c*. During the time the input pulse from source 8 is impressed on conductor 7, both the flip-flop of stage No. 1 as represented by tunnel diode 11 and transistor 10 and the flip-flop of stage No. 2 as represented by tunnel diode 21 and transistor 20 are partially ON. That is, the limited current from the source through resistor R1 is divided between the collector circuits of transistors 10 and 20 so that each is partially conducting. When the pulse from the source 8 is removed, a small but finite time lag exists between the time the pulse disappears from conductor 7 and the time for the disappearance of that pulse as it appears on the collector of transistor 12 and consequently the input to the flip-flop of stage No. 2. During this brief interval of time which corresponds to the turn-off time of transistor 12, the current limiting action of resistor R1 together with the persistence of the negative pulse on the base of transistor 20 causes transistor 20 to become fully saturated and transistor 10 to fully cut off.

Thus, it is evident that the incidence of negative pulse from source 8 acts to turn the previously ON stage No. 1 OFF and causes the succeeding stage to change from an OFF to an ON or conducting condition. Stage No. 2 is now in precisely the same condition that stage No. 1 had previously been in and is, therefore, capable of responding to the next negative advance pulse from source 8 in the same manner that stage No. 1 had responded earlier.

It has been found that by using the transistor tunnel diode configuration biased as a bistable flip-flop and connected as shown in FIG. 3, a shifting circuit capable of operating from unipolar input pulses of 120 megacycles frequency is readily attainable. It is also to be noted that while it is an advantage of this shifting circuit to respond to unipolar input pulses, the circuit is also capable of responding to bipolar pulses and in addition, the zener diode 5 may be replaced without impairment of operation by a judiciously chosen resistor.

It is to be understood that the above-described arrangements are illustrative of the application of the principles of the invention. Numerous other arrangements may be devised by those skilled in the art without departing from the spirit and scope of the invention.

What is claimed is:

1. A shifting circuit including a single unipolar pulse source, a chain of bistable flip-flop stages each comprising a switching transistor having input, output, and common electrodes, a bistably biased negative resistance diode exhibiting a high and a low potential across its terminals, and means connecting said negative resistance diode between said input and common electrodes of said switching transistor to control the potential at said output electrode of said transistor, each of said bistable flip-flop stages having a set and a reset state corresponding, respectively, to a set and reset potential at said output electrode of said switching transistor, and means for advancing a set state in one of said stages to the next stage in said chain and resetting said one previously set stage comprising a gating transistor interconnected between each of the adjacent stages and having first, second and third electrodes, negligible impedance DC paths connecting said first electrode directly to said source and said second and said third electrodes respectively to an output and an input electrode of the switching transistors in adjacent stages in said chain, said gating transistors being responsive to the joint incidence of a pulse from said source and said set potential existing in one of said stages for establishing said high potential across the diode in the next stage adjacent to said one set stage, and reset biasing means for establishing a single stable configuration of flip-flop stages wherein said next stage adjacent to said one set stage remains set and all other stages are reset after the termination of said pulse from said source, said reset biasing means having a current limited source connected in common to each of said stages for restricting the current to a value sufficient to maintain the existence of said set potential in only one of said stages.

2. A shifting circuit in accordance with claim 1 wherein said switching transistors and said gating transistors are of opposite conductivity types, each of said switching transistors having base, emitter, and collector electrodes corresponding, respectively, to said input, common, and output electrodes, each of said gating transistors also having emitter, base, and collector electrodes corresponding, respectively, to said first, second, and third electrodes, and wherein each of said negative resistance diodes is a tunnel diode.

3. A shifting circuit in accordance with claim 2 wherein said reset biasing means further comprises a series circuit common to each of said stages including a battery, a current limiting resistor, a first tap point, a voltage breakdown diode, and a second tap point, and wherein a resistor is connected between said first tap point and the collector electrode of each of said switching transistors, a biasing resistor is connected between said second tap point and the base of each of said switching transistors, and the emitters of said switching transistors are connected in common to a reference potential.

References Cited

UNITED STATES PATENTS

| | | | |
|---|---|---|---|
| 2,594,336 | 4/1952 | Mohr | 328—52.5 |
| 2,646,534 | 7/1953 | Manley | 328—52.5 |
| 3,102,209 | 8/1963 | Pressman | 307—88.5 |
| 3,109,108 | 10/1963 | Fennick et al. | 307—88.5 |
| 3,121,176 | 2/1964 | Burns et al. | 307—88.5 |
| 3,134,031 | 4/1964 | Fennick et al. | 307—88.5 |

ARTHUR GAUSS, *Primary Examiner.*

J. S. HEYMAN, *Assistant Examiner.*